United States Patent [19]
Knight

[11] Patent Number: 5,869,398
[45] Date of Patent: Feb. 9, 1999

[54] ETCHING OF INDIUM PHOSPHIDE MATERIALS FOR MICROELECTRONICS FABRICATION

[75] Inventor: D. Gordon Knight, Munster, Canada

[73] Assignee: Northern Telecom Limited, Montreal, Canada

[21] Appl. No.: 994,453

[22] Filed: Dec. 19, 1997

[51] Int. Cl.⁶ ............................. H01L 21/02
[52] U.S. Cl. ............................. 438/689; 438/706
[58] Field of Search ........................ 438/689, 706, 438/120

[56] References Cited

U.S. PATENT DOCUMENTS

| | | | |
|---|---|---|---|
| 4,671,847 | 6/1987 | Clawson | 438/718 |
| 5,211,758 | 5/1993 | Ota | 118/722 |
| 5,221,356 | 6/1993 | Hillier et al. | 118/730 |

OTHER PUBLICATIONS

K. Shimoyama, et al in J. Crystal Growth 107 (1991) 767, entitled "A new selective MOVPE regrowth process utilizing in–situ vapor phase etching for optoelectronic integrated circuits".

C. Caneau, et al in J. Crystal Growth 107 (1991) 203–208, entitled "Etching of InP by Hcl in an OMVPE reactor".

W.T. Tsang, et al in J. Crystal Growth 107 (1994) 42–49, entitled "In–situ dry etching of InP using phosphorus trichloride and regrowth inside a chemical beam epitaxial growth chamber".

N. Puetz, et al in J. Electronic Materials, vol. 17, No. 5, (1988) 381–386, entitled The Inverted Horizontal Reactor: Growth of Uniform InP and GaInAs by LPMOCVD.

*Primary Examiner*—Benjamin Utech
*Assistant Examiner*—Lynette T. Umez-Eronini
*Attorney, Agent, or Firm*—Angela C. de Wilton

[57] ABSTRACT

A method of etching of indium phosphide (InP) semiconductor materials using methyl chloride $CH_3Cl$ and phosphine $PH_3$ in a low pressure MOCVD reactor is provided. Etching of InP using $CH_3Cl$ as an etchant and $PH_3$ to prevent thermal decomposition of the etched surface gives excellent etching morphology, and a maximum etching rate of 0.75 mm/hr for the $CH_3Cl$ flow rates studied. A $PH_3$ flow rate $\leq 40$ SCCM and etching temperature $\geq 610°$ C. provided excellent etch morphology, without formation of pits, independent of the $CH_3Cl$ flow rate. A controllable etching rate was obtained for a coated susceptor when deposits are primarily InP. Thus this method of $CH_3Cl$ etching is suitable for multiple growth and etching steps using an MOCVD reactor. By controlling the $PH_3$ flow for a coated susceptor, the etching rate as a function of distance from the leading edge of a wafer can be linearized, to provide for a uniform etch rate over the entire wafer when a rotating susceptor is used. Use of an in-situ $CH_3Cl$ etch reduces both the total and active amounts of contaminants seen at the regrowth interface. The uniform etching rate combined with the reduction in interface contamination is advantageous for $CH_3Cl$ in etching in combination with MOCVD InP crystal growth.

13 Claims, 7 Drawing Sheets

ETCHING OF INDIUM PHOSPHIDE MATERIALS FOR MICROELECTRONICS FABRICATION

FIELD OF THE INVENTION

This invention relates to etching of indium phosphide semiconductor materials, for microelectronic and optoelectronic device fabrication.

BACKGROUND OF THE INVENTION

Fabrication of semiconductor devices for microelectronics and optoelectronics typically requires a series of growth or deposition process steps and etching process steps. For example, in fabrication of buried heterostructure semiconductor lasers, after forming an active layer on a semiconductor substrate and etching a mesa ridge through the active layer, selective area epitaxial regrowth around the mesa ridge is required. In this type of structure, edges of the active layer are exposed after etching, and during the regrowth step. A significant challenge for metal-organic chemical vapour deposition (MOCVD) growth is removal of residual contaminants at the regrowth interface.

Thermal decomposition along the mesa sidewalls during a heat-up cycle before regrowth may create non-radiative recombination centres, which would degrade the reliability of the device. For example, failure of devices grown on InP has been attributed to defects originating at the mesa sidewall. Typical contaminants of InP surfaces are oxygen, and silicon, which is a n-type dopant in InP.

In fabrication of integrated circuits and optoelectronic devices, advanced growth and processing for device integration typically requires multiple in situ growth and etching steps, i.e. sequences of process steps carried out in the same reactor, to reduce opportunities for surface contamination between process steps. For example, where semiconductor layers are deposited by low pressure MOCVD, an compatible method of in situ vapour etching in the same MOCVD reactor is desirable.

Known methods of in-situ vapour etching of GaAs materials use HCl, or etchant precursors including $AsCl_3$ or $CH_3I$. In use of the latter two etchants, the precursor pyrolizes in a hot zone of a reactor to provide reactive species, believed to be HCl or HI respectively. As described by Shimoyama et al., in J. Crystal Growth 107 (1991) 767, in situ etching of GaAs/AlGaAs hetero-strutures using HCl before crystal growth of subsequent layers was useful in preventing surface oxidation of etched AlGaAs and accumulation of impurities at the regrown interface.

Etching of InP in an MOCVD reactor using HCl gas is discussed, for example, by C. Caneau et al., in J. Crystal Growth 107 (1991) p.203 and by P. D. Agnello et al., in J. Crystal Growth 73 (1985) p.453. However, it was found that etching could not be done reproducibly on a susceptor (i.e. wafer support and heater) that was previously coated with deposits from previous growths. This is a disadvantage when a series of growth steps and etching steps must be carried out.

Etching in HCl alone may result in poor surface morphology with pits. Good etching morphology has been achieved at crystal growth temperatures by providing a phosphorous overpressure at the wafer surfaces as well as an etchant gas during etching of InP. For example, $PH_3$ may be added as a phosphorus source during etching. The Caneau reference describes HCl etching in an MOCVD reactor where $PH_3$ was added as a phosphorus source during etching. Low partial pressures of HCl and $PH_3$ and an etching temperature of at least 625° C. were necessary to avoid the formation of pits in the etched material. It was necessary to use a bare susceptor, free of deposits, to achieve reproducible etching rates.

Another known method of etching indium phosphide semiconductor materials for advanced integrated microelectronic and optoelectronic circuit applications is chemical beam etching with a combination etchant and surface preservative. For etching in a Chemical Beam Epitaxy (CBE) apparatus, typically $PCl_3$ is used as a combined etchant and phosphorus source, as described by W. T. Tsang et al., in J. Crystal Growth 136 (1994), p. 42.

SUMMARY OF THE INVENTION

The present invention seeks to provide a method of etching indium phosphide (InP) semiconductor materials which overcomes or avoids the above mentioned problems.

It is an object of the invention to provide an etching process for InP semiconductor materials which provides improved etch rate stability and uniformity suitable for device fabrication.

Thus, according to one aspect of the present invention there is provided a method of etching indium phosphide semiconductor materials in a low pressure reactor, comprising: heating the indium phosphide semiconductor material and exposing the indium phosphide semiconductor material to a gaseous mixture of an etchant gas comprising methyl chloride and a phosphorus source gas.

Advantageously the ratio of the etchant gas, methyl chloride, $CH_3Cl$, and a phosphorus source gas, e.g. phosphine $PH_3$ or $PCl_3$, may be independently controlled to adjust etch characteristics. It is believed that etching at typical crystal growth temperatures proceeds due to partial pyrolysis of methyl chloride resulting in formation of HCl. Phosphine is added as a phosphorus source, i.e. as a surface preservative gas to maintain good surface morphology.

Etch rates with methyl chloride are lower than for etching using HCl gas as the etchant. However, since methyl chloride is non-corrosive, it has advantages for ease of handling compared with other conventional corrosive etchant gases conventionally used for etching indium phosphide. The ozone depletion potential of methyl chloride is small, and the applicants are not aware of plans for restricting the use of this reactant in semiconductor processing for environmental reasons.

The $PH_3$ flow rate may be adjusted independently of the etchant gas flow rate, to control etch morphology. Etch morphology was independent of the $CH_3Cl$ flow rate. Beneficially, lower $PH_3$ flow rates resulted in a linear increase in etching rate from the leading to trailing edge of an InP wafer, so that a uniform etch rate over the whole surface of the wafer may be obtained with a rotating susceptor.

Appropriate etch gas ratios, temperature and pressure provides improvements in etch rate stability and uniformity across a sample wafer compared with known conventional indium phosphide etch processes.

Beneficially, the etchant gas consists of 5% $CH_3Cl$ in H2 as at a flow rate of 25–100 SCCM and, a $PH_3$ flow rate 12.5 to 100 SCCM.

For example a flow rate $\leq 40$ SCCM $PH_3$ and an etching temperature $\geq 610°$ C. provided good morphology without etch pits, and good etch rate uniformity across a sample wafer when using a rotating susceptor. For example, the etchant gas may be CH$_3$Cl at a flow rate 1.25 to 5 SCCM in a H$_2$ ambient at a flow rate of 7.3 SLM, with up to 25 SCCM PH$_3$. A flow rate of 5 SCCM CH$_3$Cl, and 12.5 SCCM PH$_3$ at an etch temperature of 630 C. provided good results on test samples in the available MOCVD apparatus, including on a coated susceptor.

Conveniently, etching is carried out at a reduced pressure, for example, at about 76 Torr in a MOCVD reactor. Etching was investigated over a temperature between 580° C. and 710° C., and preferably etching is carried out at a temperature between 610° C. and 650° C. to provide an appropriate etch rate, etch rate uniformity and good etch morphology.

Reduced amounts of contaminants, e.g. active silicon and oxygen were observed at a regrown interface compared with conventional known etch processes for InP, The process may be particularly advantageous for application as an in-situ etch immediately before MOCVD crystal growth of InP, to etch initial structures and/or remove thermally decomposed material and contaminants, and provides a stable and uniform etching rate over the whole surface of an InP wafer, on a coated rotating susceptor. Thus, the etching process may be performed at any point in a series of etching and growth steps, and is suitable for high yield manufacturing.

BRIEF DESCRIPTION OF THE DRAWINGS

Embodiments of the invention will now be described by way of example, with reference to the accompanying drawings, in which.

DETAILED DESCRIPTION OF THE EMBODIMENTS

Etching and MOCVD growth of InP according to a first embodiment of the present invention was carried out in an inverted horizontal reactor of the type described in N. Puetz et al. in J. Electronic Materials 17 (1988) p. 381. at a pressure of 76 Torr. This type of MOCVD reactor is typically used for III–V crystal growth of epitaxial layers of semiconductor materials such as indium phosphide.

Figure 1:
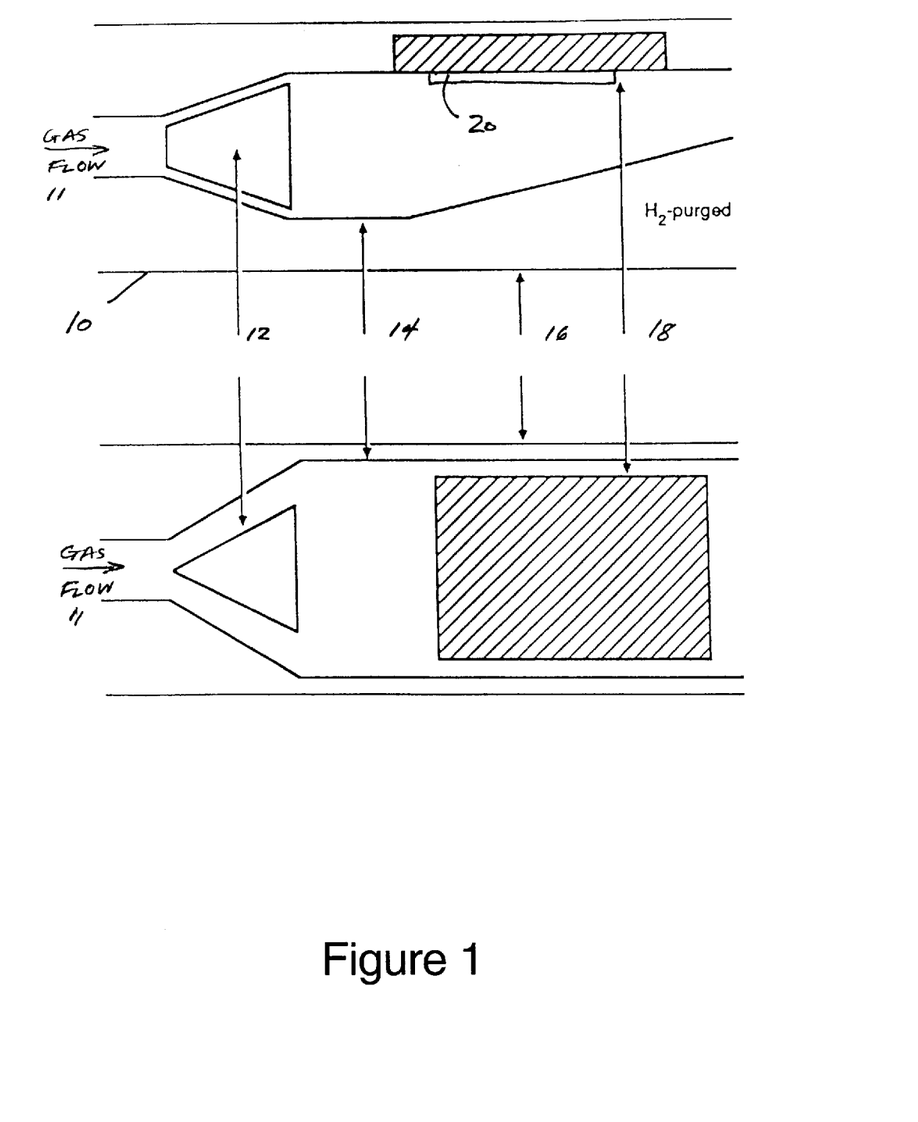
FIG. 1 shows a schematic side and top cross-sectional views of of a low pressure MOCVD reactor suitable for etching an indium phosphide semiconductor material by a method according to a first embodiment of the invention.

FIG. 1 shows an inverted horizontal reactor as described by Puetz.

A side cross-sectional view in FIG. 1 shows the chamber 10 with deflector 12 and rectangular insert 14 to direct gas flow from gas inlet 11 over the susceptor 18 for supporting and heating a sample wafer 20 mounted on the susceptor 18.

A corresponding top cross-sectional view is shown in FIG. 1.

A sample wafer comprising a surface layer of indium phosphide was supported on a graphite susceptor, i.e. a combined wafer support and heater, providing a 'hot zone' around the sample in the reactor. When a fixed wafer susceptor was used, it was either bare, or coated with deposits from previous growth steps. Alternatively, an inverted rotating susceptor, as described in U.S. Pat. No. 5,221,356 to G. Hillier entitled "Apparatus for manufacturing semiconductor wafers" was alternatively used, in which case the susceptor was coated with deposits from previous growth steps.

After mounting the sample wafer of InP in the apparatus as shown in FIG. 1, a mixture of non-reactive gases, i.e. an H$_2$ ambient at a flow rate of 7.3 SLM, and PH$_3$ as a surface preservative were flowed into the chamber and around the wafer during a heat up phase. The PH$_3$ provides a phosphorus overpressure and thereby reduces thermal decomposition of the InP surface during heating. The heated sample wafer was then exposed to the reactive gas mixture comprising a mixture of an etchant gas, methyl chloride, and a phosphorus source gas, phosphine, which were introduced into the reactor at controlled flow rates and pressures so as to react with the sample in the hot zone of the reactor. Flow rates of the two gases were controlled independently so that the ratio of the reactive gases may be selected to control the etch characteristics. For example, the etchant gas mixture comprises 5% CH$_3$Cl in H2 as at a flow rate of 25–100 SCCM; this is equivalent to a CH$_3$Cl flow rate 1.25 to 5 SCCM. Analyzed oxygen and water content of the gas mixture was 0.15 ppm and 6.4 ppm respectively. To provide a phosphorus overpressure, a PH$_3$ flow rate 12.5 to 100 SCCM was maintained during etching of InP. During heat up, a PH$_3$ flow rate of 115 SCCM was used. Etching was carried out in a H2 ambient at a flow rate of 7.3 SLM.

The temperature dependence of etching was investigated over the range from 580° C. to 710° C. After evaluating the temperature dependence of the etch rate, preferably a temperature of between 610° C. and 650° C., and typically 630° C. was used for reasons explained below.

Example:

1. Determination of etch rates.

Substrate wafers were Fs doped <100> oriented InP. 1200Å SiO$_2$ was deposited on the wafer and etched to define 150 μm circular areas for testing etch rates. Following etching, the etch depth of the circular mesa created by etching was measured using a Dektak stylus after stripping the oxide layer.

Wafers were precleaned before etching in a 5:1:1 mixture of H$_2$SO$_4$:H$_2$O$_2$:H$_2$O (sulfuric/peroxide etch) for 90 seconds, followed by a DI (deionized) water rinse, and N$_2$ blow dry, which removed a thin surface layer of InP (about 0.018 μm) to expose a fresh surface layer.

2. Determination of interfacial contamination.

Following surface preparation, the surface quality of regrown interface was evaluated by growing epitaxial layers of InP, 4 μm thick, on the substrate Fe doped InP surfaces, in a $H_2$ ambient at a flow rate of 7.3 SLM using trimethyl indium to provide an InP growth rate of 1.5 μm/hr.

A layer of epitaxial InP was grown on sample wafers with and without a 6 minute $CH_3Cl$ in situ etch preceding InP growth. The samples were then analyzed to determine the effect of the etch on contamination of the interface between substrate and epitaxial layer. The total amount of oxygen and silicon at the regrowth interface was determined using Secondary Ion Mass spectrometry (SIMS) and the amount of active carriers at this interface was evaluated using two layer conduction Hall analysis at 77K.

TABLE 1

Active interfacial Si determined by Hall analysis, and total interfacial Si and O determined by SIMS, for $CH_3Cl$ etched and unetched samples.

| sample | Active Si (cm$^{-2}$) | Total Si (cm$^{-2}$) | Total O (cm$^{-2}$) |
|---|---|---|---|
| control | $1.0 \times 10^{12}$ | $7 \times 10^{12}$ | $6 \times 10^{12}$ |
| with $CH_3Cl$ etch | $3.0 \times 10^{11}$ | $2 \times 10^{12}$ | $3 \times 10^{12}$ |
| control | $1.0 \times 10^{12}$ | $5 \times 10^{12}$ | $9 \times 10^{12}$ |

Etching Mechanism

Figure 2:
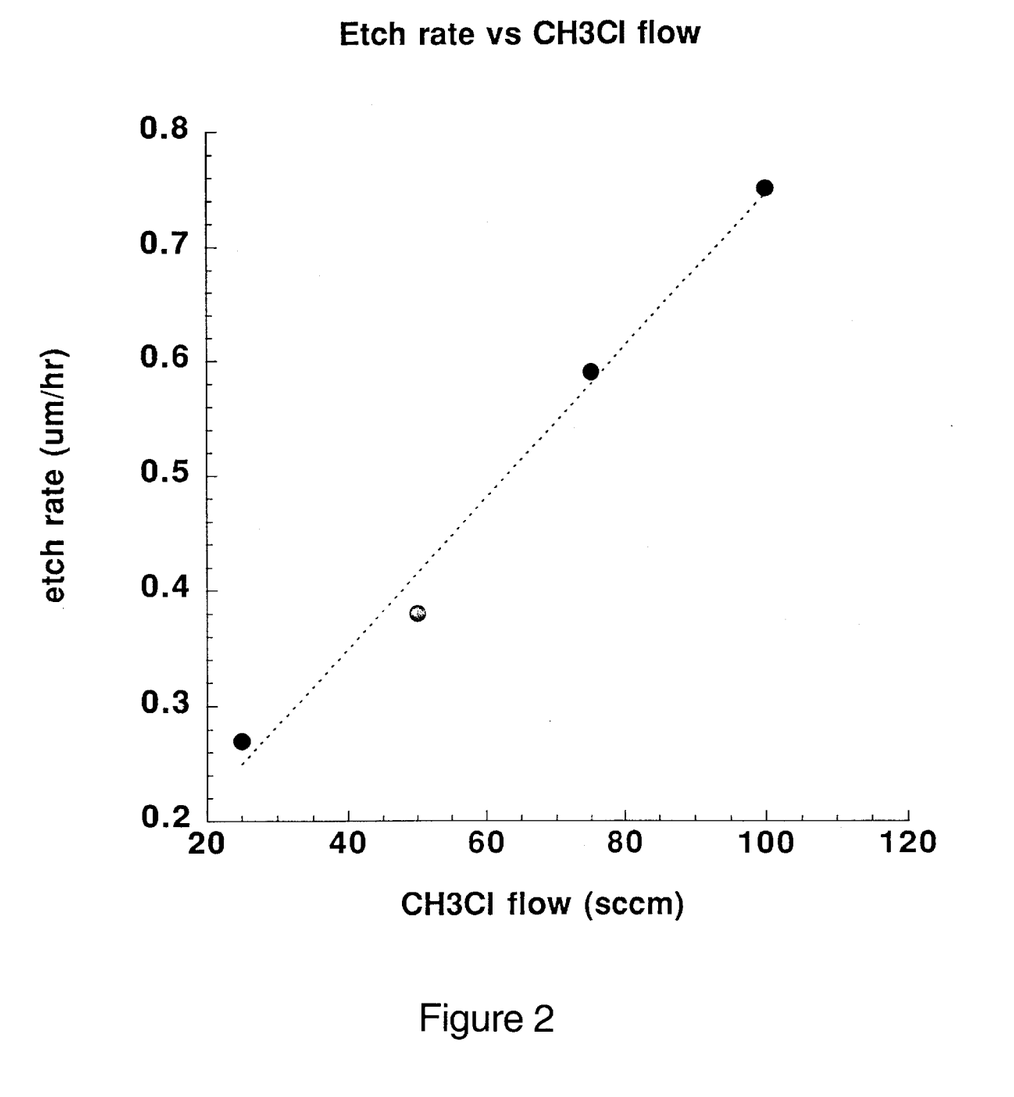
FIG. 2 shows the etch rate as a function of methyl chloride flow rate for the method according to the first embodiment, using a flow rate of 25 SCCM of phosphine.

The dependence of the etching rate of InP on the $CH_3Cl$ flow rate at constant $PH_3$ flow rate of 25 SCCM is shown in FIG. 2, where an excellent linear relationship was obtained. The etching morphology for all $CH_3Cl$ flow rates was excellent. At a $CH_3Cl$ flow rate of 1.25 SCCM, an etch rate of 0.27 μm/hr was obtained. With similar etch conditions and a partial pressure of HCl of 0.016 Torr (~1.5 SCCM) using our ambient flow rate, Caneau et al obtained an etch rate of 36 μm/hr.

The etching rate in this work using $CH_3Cl$ is only 0.7% of the etch rate obtained using HCl gas as the etchant gas, suggesting that only a small fraction of $CH_3Cl$ has pyrolized at 630° C.

Assuming that methyl chloride gas decomposes in the hot zone of the reactor to form a reactive compound, probably hydrogen chloride, which then etches the surface of the InP wafer, a possible reaction mechanism is:

$$CH_3Cl + H_2 \rightarrow CH_4 + HCl \qquad [1]$$

$$HCl + InP \rightarrow InCl + \tfrac{1}{2} P_2 + \tfrac{1}{2} H_2 \qquad [2]$$

where the equilibrium equation would then be:

$$k(T) = [InCl_{adsorbed}]\, pP_2^{1/2}\, pH_2^{1/2}\, pHCl^{-1} \qquad [3]$$

where p is the partial pressure of each species and k is the equilibrium constant.

Assuming a dissociation fraction α and β for $PH_3$ and $CH_3Cl$ so that $pP_2 = \alpha \cdot pPH_3$ and $pHCl = \beta \cdot pCH_3Cl$, the equilibrium would then be:

$$k(T) = \alpha^{1/2} \beta^{-1} [InCl\ adsorbed]\, pPH_3^{1/2}\, pH_2^{1/2}\, pCH_3Cl^{-1} \qquad [4]$$

The etching rate should be inversely proportional to equation [4] assuming the etching process is near equilibrium and that accumulation of InCl on the surface does not occur. A linear dependence on the etch rate on $CH_3Cl$ concentration is predicted and observed as shown in FIG. 2. Caneau et al. in the above mentioned reference, observed a sublinear dependence of etch rate on HCl concentration, which they attributed to accumulation of InCl on the surface. Since etching rates in this work are <1% of those observed by Caneau, it is plausible that the slower etch rates allows for desorption of InCl.

Figure 3:
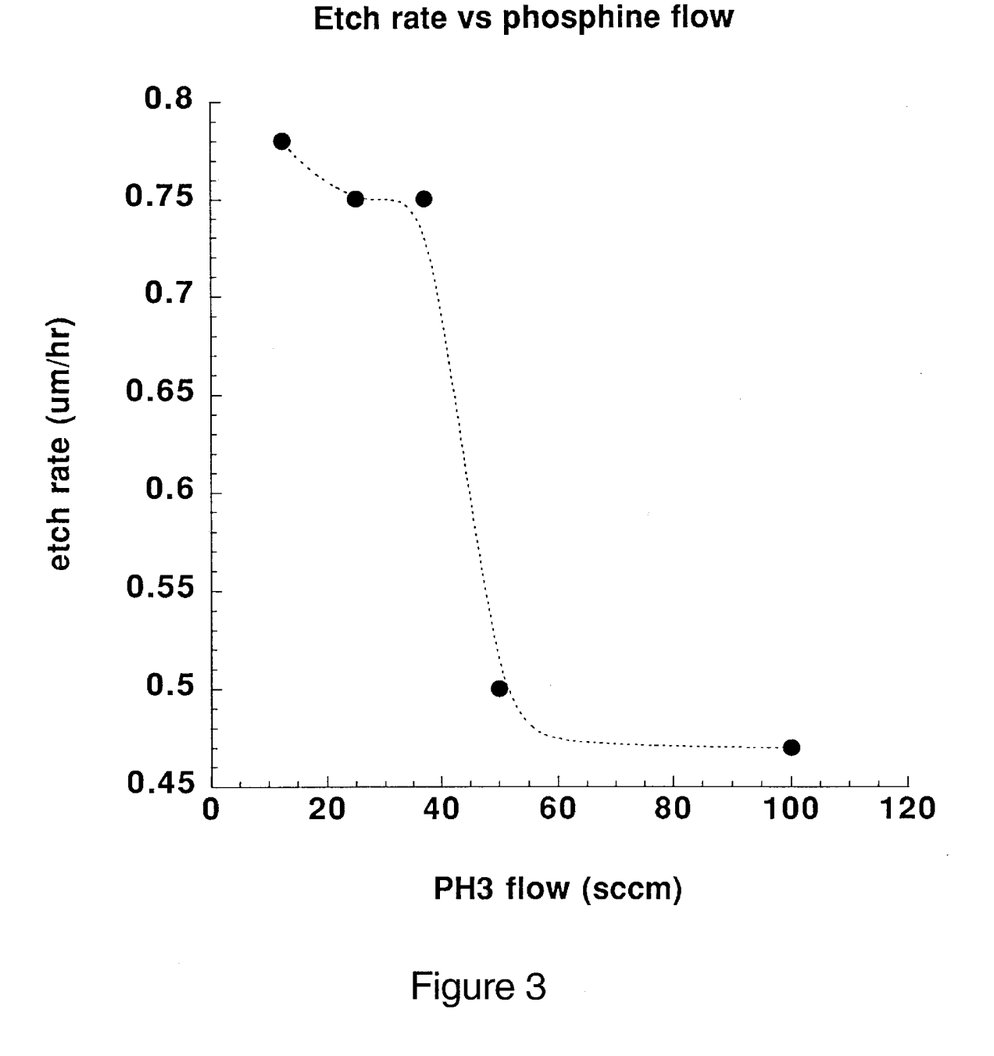
FIG. 3 shows the dependence of etch rate on PH$_3$ flow at 5.0 SCCM methyl chloride.

The dependence of etch rate on $PH_3$ flow at 5.0 SCCM $CH_3Cl$, shown in FIG. 3 is not the inverse square root relationship predicted by equation [4]. This deviation from expected behaviour occurs at $PH_3$ flow rates that are much higher than the $CH_3Cl$ flow rates used above, so that the reaction condition in this flow regime may be different. The surface morphology of etch wafers was excellent for $PH_3$ flows ≦25 SCCM. A few oval pits were observed for higher flow rates. Similar observations were made during HCl etching, and these pits were located primarily at the periphery of the wafer where the etch pit density for the substrate is expected to be highest.

Figure 4:
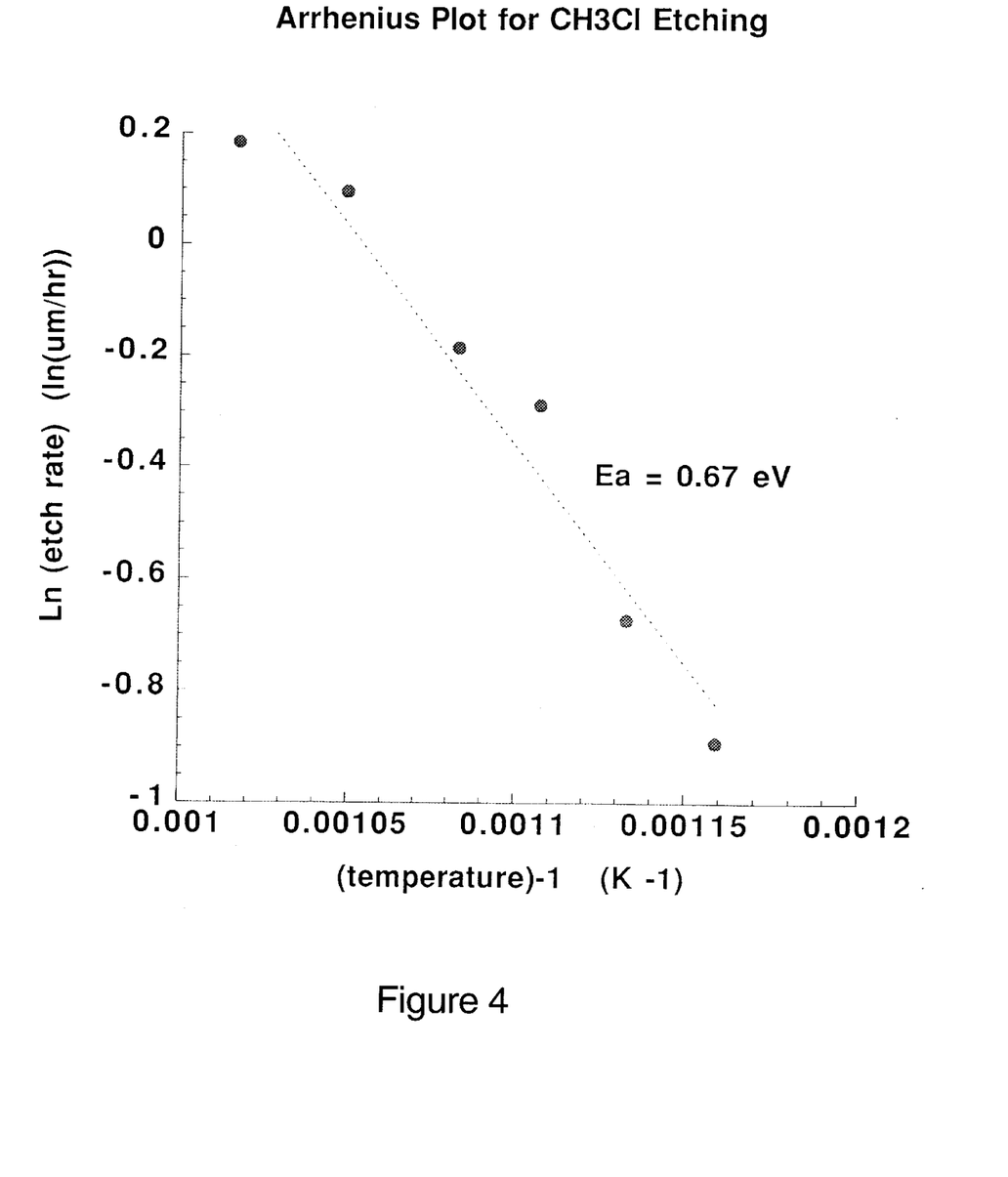
FIG. 4 shows an Arrhenius plot for methyl chloride etching.

An Arrhenius plot showing the temperature dependence of the etch rate at $CH_3Cl$ and $PH_3$ flow rates of 5.0 SCCM and 25 SCCM respectively is shown in FIG. 4. A reasonably linear Arrhenius plot was obtained over the temperature range studied and an activation energy of 0.67 eV for etching with $CH_3Cl$ was derived.

Oval pits were observed for wafers etched at temperatures ≦610° C. suggesting that there is a possibility that InCl desorption is hindered at lower temperatures. It has previously been postulated that pits indicate non equilibrium concentrations of InCl at surfaces. Good surface morphology was obtained for temperatures above 610° C.

These pits also appear for $PH_3$ flows ≧40 SCCM which coincide with a sudden decrease in etch rate seen in FIG. 3. The reaction conditions for higher $PH_3$ flow rates is changed, perhaps by reducing the efficiency of desorption of InCl. The sudden drop in etch rate and appearance of etch pits is consistent with a non equilibrium surface concentration of InCl.

Consequently, it is apparent that the etching chemistry of $CH_3Cl$ is more complicated than the simple model proposed above at lower temperatures and higher $PH_3$ flow rates.

By way of comparison, for MOCVD growth, the growth rate is exponentially dependent on temperature initially, where the decomposition kinetics of the precursor species is the limiting step, and is then independent of temperature when the process becomes mass transport limited.

It would appear that only ~1% of the $CH_3Cl$ contributes to etching relative to etching with HCl gas at 630° C. This observation suggests that the majority of the $CH_3Cl$ is still unreacted. The exponential dependence of growth rate on temperature and the large fraction of unreacted $CH_3Cl$ both indicate a kinetically limited reaction in the temperature range studied.

Etch rate uniformity

Figure 5:
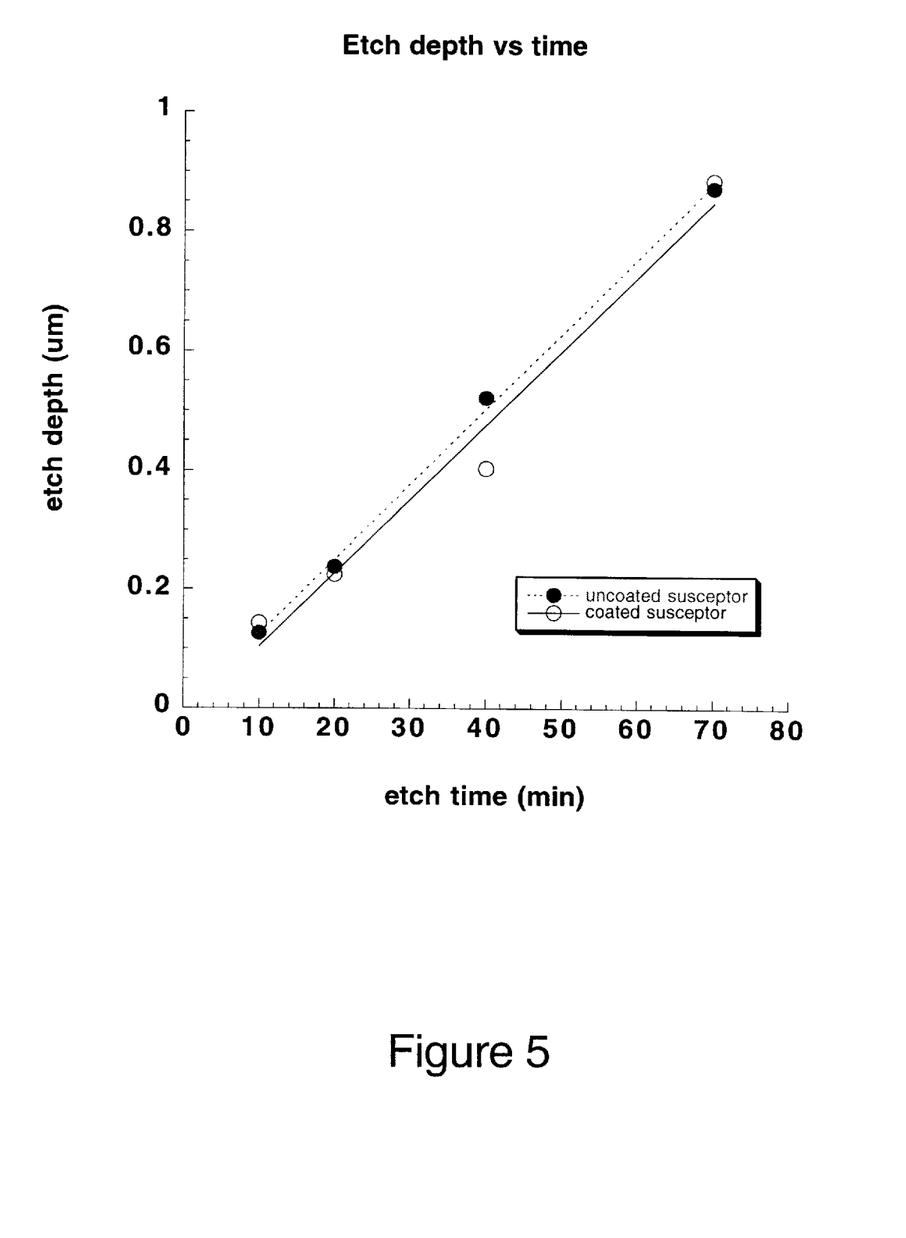
FIG. 5 shows a graph of etch depth as a function of etching time for an InP wafer on an uncoated susceptor (closed circles) and on coated susceptor (open circles) using a method according to the first embodiment of the inventions.
Figure 6:
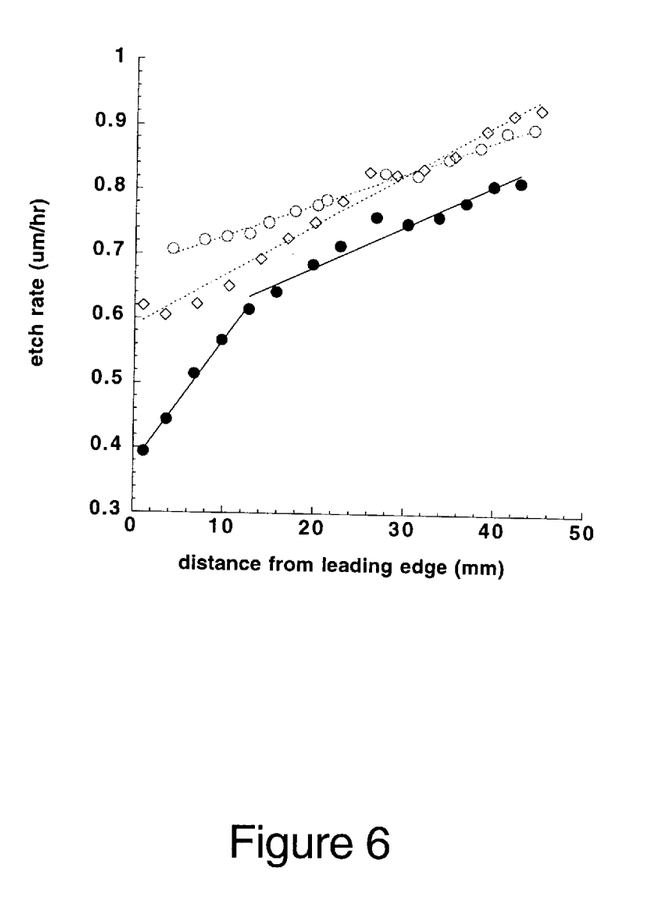
FIG. 6 shows a graph of etch rate as a function of distance from the leading edge of a InP wafer in the direction of gas flow: for an uncoated susceptor with 25 SCCM PH$_3$ (open circles); for a coated susceptor with 12.5 SCCM PH$_3$ (open diamonds); and for coated susceptor with 25 SCCM PH$_3$ (closed circles)

The etch rate as a function of distance from the leading edge of the wafer in the direction of gas flow is shown in FIG. 5. The susceptor has a fixed orientation at a $CH_3Cl$ flow rate of 5.0 SCCM. A linear increase in etch rate with distance is observed for the uncoated susceptor at 25 SCCM $PH_3$ and the coated susceptor at 12.5 SCCM $PH_3$. For the coated susceptor at 25 SCCM $PH_3$, the increase in etch rate with distance is much more rapid for the first 15 mm, and all the data can only be approximated to a linear fit if two separate regions are used.

Perpendicular to the direction of gas flow, the etching rate is uniform for all the conditions used. A possible explanation for the increase in etch rate along the direction of flow is more complete pyrolysis of $CH_3Cl$ as the gas passes over the hot susceptor. Perpendicular to the direction of flow the pyrolysis time would be the same and the etching rate should be uniform, which was observed.

Figure 7:
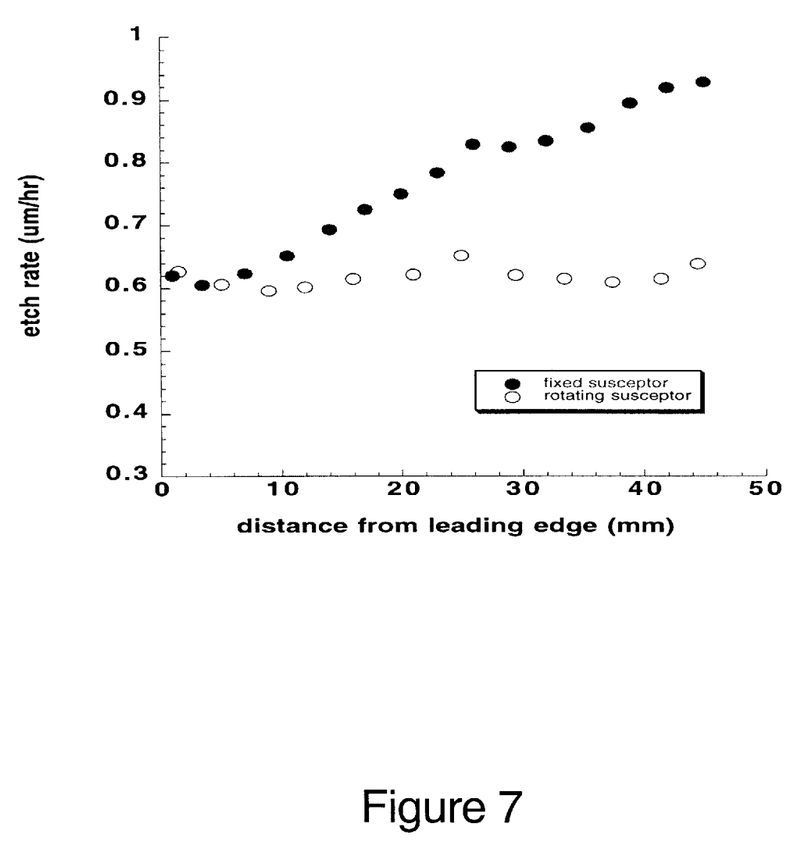
FIG. 7 shows a graph of etch as a function of distance from the edge of the wafer opposite the major flat: for a wafer with a fixed orientation (closed circles); and for a wafer etched supported on a rotating susceptor (open circles).

In the direction of flow, increasing the amount of phosphorus, either using a coated susceptor coated with phosphorus containing deposits, or by increasing the $PH_3$ flow causes a lowering of the etching rate and a steeper increase of etch rate with distance. The worst case is for a coated susceptor at 25 SCCM $PH_3$, where the etch rate increase is no longer linear. By reducing the $PH_3$ flow to 12.5 SCCM with a coated susceptor, a linear increase in etch rate with distance can be achieved. This is important, since it is desirable to use a coated susceptor for actual etching and regrowth. This linear increase can then be averaged out to give a uniform etching rate for the whole wafer if a rotating susceptor is then used. A comparison between the etching rate in the direction of flow for a fixed susceptor, and for a rotating susceptor along the same orientation of the wafer is shown in FIG. 7.

The $PH_3$ and $CH_3Cl$ flows are 12.5 and 5.0 SCCM respectively. There is a dramatic improvement in the etch rate uniformity for the rotating susceptor, where it is now uniform over the entire distance sampled. The average etch rate for the wafer is 0.616±0.020 mm/hr, which is±3.2% standard deviation. This degree of control of the etching process is well suited for whole-wafer processing. Thus, by controlling the $PH_3$ flow when using a coated susceptor, the increase in etching rate as a function of distance form the leading edge of the wafer with a fixed orientation can be made linear. This resulted in a uniform etch rate for the entire wafer when a rotating susceptor was used, where an etching uniformity of+/−3.2% has been achieved.

Significantly, a controllable etching rate was obtained when using a coated susceptor when the susceptor deposits are primarily InP and contain little arsenic. Thus advantageously, $CH_3Cl$ etching is suitable for multiple growth and etching steps using an MOCVD reactor.

Reduced Interfacial Contamination

Removal of residual contaminants at the regrowth surface may be a significant challenge for MOCVD growth, since layers such as active layers of semiconductor lasers are exposed during the regrowth step. An unintentionally doped contamination layer may adversely affect the electrical characteristics of devices such as high electron mobility transistors and field effect transistors. The two most common contaminants for InP based epitaxy are silicon and oxygen.

Growth experiments were carried out after a sulfuric peroxide clean followed by an in situ $CH_3Cl$ etch for 6 minutes immediately before crystal growth. $CH_3Cl$ was very effective in removing active Si and also removed silicon oxides SiOx. The in situ $CH_3Cl$ etch was effective in removing both total silicon, active silicon and O contamination.

Use of an in situ $CH_3Cl$ etch reduces both the total amount of contaminants and the active amounts of contaminants seen at the regrowth interface. The uniform etching rate combined with the reduction in interface contamination makes $CH_3Cl$ in situ etching a desirable process in combination with MOCVD crystal growth.

The process allows etching and growth steps to be carried out in the same apparatus, which is useful in the fabrication of advanced integrated components where a series of growth and etch steps are required.

The etch process allows for removal of surface contaminants on an InP wafer surface or previously grown InP epitaxial layers immediately before crystal growth. In this way contaminants which would be incorporated into a grown structure are removed.

The methyl chloride etchant precursor is non-corrosive for ease of handling. The etchant gas mixture allows for independent adjustment of the etching gas and a phosphorus containing gas used to preserve the quality of the wafer.

Etching of InP in this manner using an MOCVD apparatus can be used to permit the growth and etching steps in device fabrication to be performed in the same apparatus, which can be beneficial in fabrication of advanced integrated devices. In situ processing of components sensitive to surface contamination, particularly useful to structures which require multiple growth and etch steps in situ.

The method described above has applications for improved etching processes for devices such as avalanche photodiodes, buried heterostructure lasers and other InP based electronic devices which are sensitive to electrically active surface contaminants.

It is believed that this etch process is applicable to InGaAsP compounds and related materials.

In summary, etching of InP using $CH_3Cl$ as an etchant and $PH_3$ to prevent thermal decomposition of the etched surface gives excellent etching morphology, and an etching rate up 0.75 mm/hr for the $CH_3Cl$ flow rates studied. Under these conditions, it was a $PH_3$ flow rate≦40 SCCM and etching temperature≧610° C. that avoids the formation of pits. Surface morphology is independent of $CH_3Cl$ flow rate.

In particular, a controllable etching rate was obtained for a coated susceptor as long as the susceptor deposits are primarily InP. A small reduction in etching rate was noted for a susceptor with deposits that contain large amounts of arsenic. Thus $CH_3Cl$ etching is suitable for multiple growth and etching steps using an MOCVD reactor. By controlling the $PH_3$ flow for a coated susceptor, the etching rate as a function of distance from the leading edge of a wafer can be linearized, to provide for a uniform etch rate over the entire wafer when a rotating susceptor is used. Etch rates up of 0.75 $\mu$m/hr were achieved with the maximum gas flow rate in the particular apparatus tested. Etches were carried out preferably in the temperature range from 630° C. to 650° C., in the presence of 12–25 SCCM phosphine to reduce decomposition of the wafer surface. For example, $PH_3$ flow rates of about 12.5 SCCM and $CH_3Cl$ flow rates about 5 SCCM at 630° C. and 76 Torr provided good results on test samples in the particular MOCVD apparatus used, although particular etch rates may be apparatus dependent.

Typically, investigation of regrown interfaces of InP show silicon and oxygen contamination, where part of the silicon is electrically active. Use of an in-situ $CH_3Cl$ etch reduces both the total and active amounts of contaminants seen at the regrowth interface. The uniform etching rate combined with the reduction in interface contamination makes $CH_3Cl$ in-situ etching a useful process for use in combination with MOCVD InP crystal growth.

Practically, reproducible etching of a sample on a susceptor with deposits is desirable because many successive growth and etching steps on the same susceptor may be required for advanced processing. This advantage allows etching to be performed at any point in a series of etching and growth steps, and is also adaptable to high yield manufacturing of devices.

Thus, it will be appreciated that, while specific embodiments of the invention are described in detail above, numerous variations and modifications of these embodiments fall within the scope of the invention as defined in the following claims.

What is claimed is:

1. A method of etching an indium phosphide semiconductor material in a low pressure reactor, comprising:
   heating the indium phosphide semiconductor material and etching the indium phosphide semiconductor material in a gaseous mixture comprising methyl chloride and a phosphorus source gas.

2. A method according to claim 1 wherein the ratio of the flow rates of the $CH_3Cl$ and the phosphorus source gas is independently controlled.

3. A method according to claim 1 wherein the gaseous mixture consists of 5% $CH_3Cl$ in $H_2$ as at a flow rate of 25–100 SCCM and, the phosphorus source gas comprises $PH_3$ at a flow rate of 12.5 to 100 SCCM.

4. A method according to claim 1 wherein gaseous mixture is $CH_3Cl$ at a flow rate of 1.25 to 5 SCCM in a $H_2$ ambient at a flow rate of 7.3 SLM.

5. A method according to claim 1 wherein the gaseous mixture consists of 5% $CH_3Cl$ in $H_2$ as at a flow rate of 25–100 SCCM and the $PH_3$ flow rate $\leq$ 40 SCCM, and the etching temperature $\geq$ 610° C.

6. A method according to claim 1 wherein the gaseous mixture comprises $CH_3Cl$ at a flow rate of 1.25 to 5 SCCM in a $H_2$ ambient at a flow rate of 7.3 SLM, and the phosphorus source gas is $PH_3$ at up to 25 SCCM.

7. A method according to claim 1 wherein the etching is carried out at a temperature between 580° C. and 710° C.

8. A method according to claim 1 wherein the etching is carried out at a temperature between 610° C. and 650° C.

9. A method according to claim 1 wherein the etching is carried out at a temperature of about 630° C.

10. A method according to claim 1 wherein etching is carried out at a pressure of about 76 Torr.

11. A method according to claim 1 wherein the step of etching is carried out in a low pressure MOCVD reactor.

12. A method according to claim 10 comprising after etching the substrate, a step of depositing a layer of indium phosphide thereon.

13. A method according to claim 1 wherein the phosphorus source gas is one of phosphine and phosphorus trichloride.

* * * * *